United States Patent [19]

Duley

[11] 4,323,886
[45] Apr. 6, 1982

[54] ANALOG-TO-DIGITAL CONVERTER CIRCUIT

[75] Inventor: Raymond S. Duley, Spring Valley, Ohio

[73] Assignee: NCR Corporation, Dayton, Ohio

[21] Appl. No.: 193,992

[22] Filed: Oct. 6, 1980

[51] Int. Cl.³ .......................................... H03K 13/20
[52] U.S. Cl. ............................ 340/347 AD; 331/111; 331/177 R
[58] Field of Search .................. 331/111, 108 D, 143, 331/177 R; 332/167; 340/347 AD, 347 M, 347 NT

[56] References Cited

U.S. PATENT DOCUMENTS

| | | | |
|---|---|---|---|
| 3,419,784 | 12/1968 | Winn | 340/347 AD |
| 3,842,371 | 10/1974 | Kelly | 331/177 R |
| 3,980,970 | 9/1976 | Grundy | 331/108 D |
| 4,001,722 | 1/1977 | Patel et al. | 331/111 |
| 4,164,759 | 8/1979 | Stubben | 358/180 |
| 4,191,932 | 3/1980 | Nagahama | 331/111 |
| 4,264,879 | 4/1981 | Duley | 331/111 |

FOREIGN PATENT DOCUMENTS 2548586  5/1976  Fed. Rep. of Germany .

Primary Examiner—Charles D. Miller
Attorney, Agent, or Firm—J. T. Cavender; Albert L. Sessler, Jr.; Elmer Wargo

[57] ABSTRACT

A circuit for generating a digital output signal from an analog input signal applied to the circuit, including: first and second capacitors; first means including a switching transistor for charging the first and second capacitors whereby the transistor switches the first capacitor out of the first charging means when a voltage across the first capacitor approaches the voltage of the analog input signal; and a comparison means including a comparator having first and second inputs thereto and an output therefrom. A second means is also included for supplying a first predetermined voltage to the first input which generates a first state at the output of the comparator, the first charging means also being effective to raise the voltage level at the second input after the first capacitor is switched out of the first charging means by charging said second capacitor to cause comparator to switch to a second state. A third means responsive to the second state of the comparator is included for supplying a second predetermined voltage to the first input and also for partially discharging the second capacitor alone and thereafter at least partially discharging the first and second capacitors together so that the output of the comparator toggles or switches back to the first state. The output of the comparator toggles between the first and second states at a frequency which is dependent upon the voltage of the analog input signal.

15 Claims, 4 Drawing Figures

ANALOG-TO-DIGITAL CONVERTER CIRCUIT

BACKGROUND OF THE INVENTION

This invention relates generally to an electronic analog-to-digital converter circuit, and specifically to one of the oscillating type which may be packaged on an integrated circuit chip.

Present analog-to-digital (hereinafter referred to as "A/D") converters generally do not have an extended frequency range in that they operate either in low frequencies or in high frequencies.

Another problem with some prior art A/D converters is that the accuracy of the outputs thereof is dependent upon accurately-controlled, stable, power sources.

SUMMARY OF THE INVENTION

This invention relates to a circuit for generating a digital output signal from an analog input signal applied to the circuit, and a preferred embodiment of this circuit comprises a comparison means having first and second inputs thereto, an output therefrom, and a first reference voltage level at the first input thereof; means for storing an electrical charge, with the storing means being operatively coupled to the second input; first means including a switching means for charging the storing means to a voltage which approaches the voltage of the analog input signal and thereafter effectively switching the storing means out of the first means; second means, coupled to the second input for switching the output of said comparison means from a first state to a second state after the storing means is switched out of the first means; and third means responsive to the second state of the comparison means for changing the voltage reference level at the first input of the comparison means to a second level, for reducing the voltage on the storing means, and also for enabling the output of the comparison means to switch to the first state when the voltage on the storing means is reduced to approximately the second level; the output of the comparison means toggling between the first and second states at a frequency which is dependent upon the voltage of the analog input signal.

One of the advantages of the circuit of the present invention is that the circuit is conducive to being placed on an integrated circuit (hereinafter referred to as an "IC") chip. Four such circuits may be placed on a single 14 pin, dual-in line, IC chip to provide low-cost, A/D converters, with only a very large capacitor (where necessary) being external to the IC chip.

Another advantage of the circuit of this invention is that it is capable of working over a larger frequency range and with more sensitivity than prior art A/D converters of the low-cost variety.

These advantages and others will be more readily understood in connection with the following specification, claims and drawing.

DETAILED DESCRIPTION OF THE INVENTION

Figure 1:
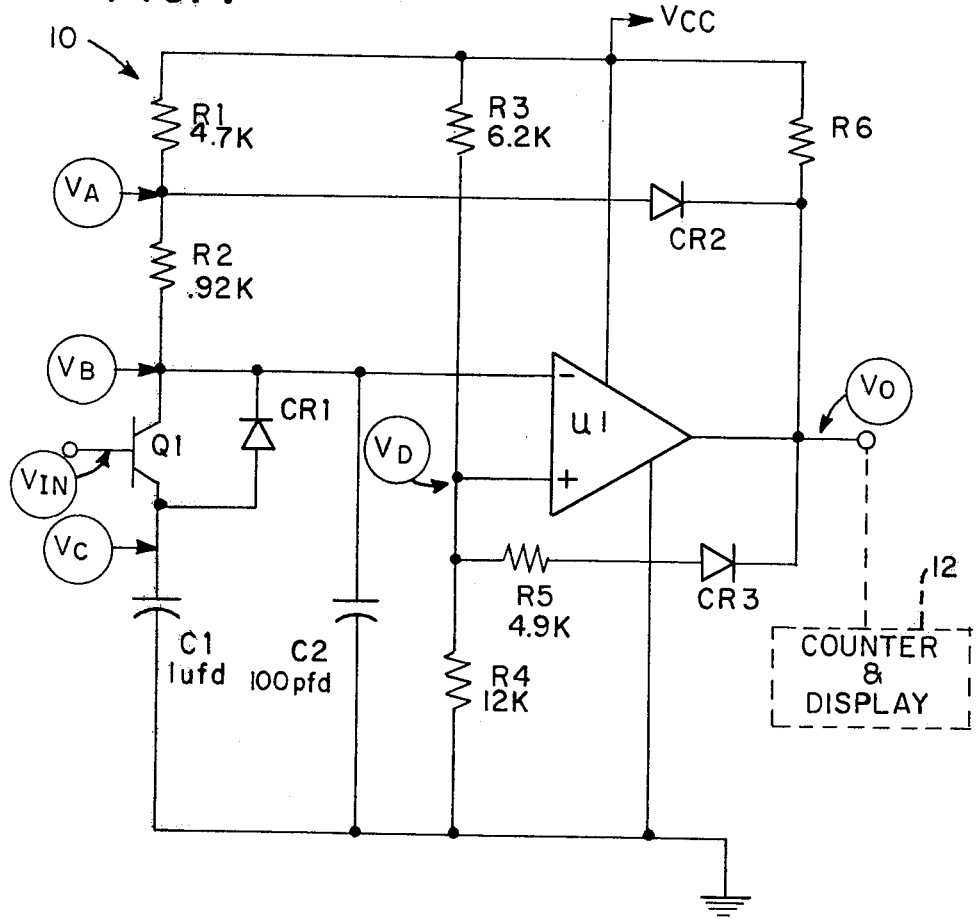
FIG. 1 is a schematic diagram of a preferred embodiment or circuit of this invention.

FIG. 1 shows a schematic diagram of a preferred embodiment of this invention which shows a low-cost, A/D circuit which will be referred to hereinafter as circuit 10.

The input $V_{IN}$ to the circuit 10 may be D.C., sinusoidal, trapezoidal or any other analog signal which may vary with respect to time. The output of the circuit 10 at junction $V_O$ is a digital signal whose frequency corresponds to the input voltage $V_{IN}$. The output of the circuit 10 at junction $V_O$ may be connected to a conventional frequency counter and display 12 (shown in dashed outline) so as to provide a correlation between the output frequency and the input parameter represented by the input voltage $V_{IN}$. Typical input voltages which are generated by the appropriate transducers (not shown) relate to pressure, temperature, and opto-electronic and the like parameters.

The circuit 10 is especially useful where low-cost, A/D converters are needed to make use of available processing capabilities of microprocessor terminals which can scale and normalize digital information.

The circuit 10 utilizes a minimum number of components when compared to prior art circuits, and it electronically switches a large storage means or capacitor $C_1$ into and out of the circuit 10 at a frequency which is dependent upon the input voltage $V_{IN}$. The circuit 10 allows the output frequency thereof to vary by a favorable ratio of about 170 to 1 whereas some prior art A/D converters which utilize the control voltage pin #5 of IC chip #LM 555, for example, allow the output frequencies thereof to change by a less-favorable ratio of 7 to 1.

The circuit 10 includes a means for comparing various signals applied to its inputs and a standard comparator U1, such as an IC chip LM 331 which is manufactured by National Semiconductor, for example, may be used. The comparator U1 is conventionally connected to a $V_{CC}$ voltage and a system ground as shown. The (+) or first input to the comparator U1 represents the non-inverting input, and the (−) or second input thereto represents the inverting input; the output of the comparator U1 is connected to the output of the circuit 10 at junction $V_O$.

A first reference voltage is supplied to the (+) input of the comparator U1 by the series-connected resistors R3 and R4, with one end of resistor R3 being connected to the $V_{CC}$ terminal and with one end of resistor R4 being connected to ground; the remaining ends of resistors R3 and R4 form a junction $V_D$ which is connected to the (+) input of the comparator U1. The resistors R3 and R4 form a voltage divider network which produces a reference voltage of ⅔ $V_{CC}$ at the (+) input of comparator U1 when power is initially supplied to the circuit 10. Typical values for the various components of a preferred embodiment of this invention are shown in FIG. 1; however, other component values could be used for different frequency outputs or parameters.

The circuit 10 (FIG. 1) includes a means for storing a charge which is represented by a large capacitor C1, and a means for charging the capacitor C1, which charging means includes the resistors R1, R2, and a switching means which is shown as an NPN transistor Q1 such as #ZN 3904, although other switching means may be used. Capacitor C1 is charged by a series circuit including the resistors R1 and R2 and the transistor Q1.

One end of resistor R1 is connected to the $V_{CC}$ terminal and the remaining end thereof is connected to one end of resistor R2 to form the junction $V_A$ therebetween. The remaining end of resistor R2 is connected to the collector of transistor Q1 to form the junction $V_B$ therebetween, with junction $V_B$ being connected to the (−) input of comparator U1. One end of the capacitor C1 is connected to the emitter of transistor Q1 to form the junction $V_C$ therebetween, and the remaining end of capacitor C1 is connected to system ground. The input analog signal $V_{IN}$ is fed into the control electrode or base of transistor Q1. A diode CR1, having its anode connected to junction $V_C$ and its cathode connected to junction $V_B$, is used to provide a discharge path for capacitor C1 as will be described hereinafter.

The circuit 10 (FIG. 1) also includes a means such as capacitor C2 which is coupled to junction $V_B$ and the (−) input of the comparator U1 for switching the output thereof from a first state (which, for example, may be a high level) to a second state (which may be a low level) after the capacitor C1 is switched out of the circuit 10 by the transistor Q1 as will be described hereinafter. In general the capacity of the capacitor C2 is very small compared to the capacity of capacitor C1 (generally in the ratio of approximately 1:1000); consequently, with capacitor C1 switched out of the circuit 10, the voltage at junction $V_B$ rises very rapidly to equal the $\frac{2}{3}$ $V_{CC}$ voltage which appears at junction $V_D$. When the voltage at junction $V_B$ equals the voltage at junction $V_D$ (disregarding the offset voltage of comparator U1), the output voltage of the comparator U1 at junction $V_O$ changes from a high level to a low level in the example being described.

When the output voltage of the comparator U1 of circuit 10 (FIG. 1) falls to a low level or to a low impedance state, the diodes CR2 and CR3 become forward biased and conduct. Diode CR2 is series connected between junction $V_A$ and junction $V_O$, and when diode CR2 is forward biased, it begins to discharge capacitor C2 first, and shortly thereafter, when the voltage at junction $V_B$ drops sufficiently to cause the diode CR1 to become forward biased, the capacitor C1 begins to be discharged. The capacitors C2 and C1 are thus discharged in parallel through the resistor R2 and diode CR2, and accordingly, the voltage at $V_B$ decreases further. At this time, current also flows from junction $V_{CC}$ through resistor R1 and diode RC2 to system ground; however, the current flowing through this leg of circuit 10 does not affect the rate at which the capacitors C2 and C1 are discharged, and therefore, it does not affect the output frequency of circuit 10.

The diode CR3 (FIG. 1) and the resistor R5 are series-connected, with one end of resistor R5 being connected to junction $V_D$ and the cathode of diode CR3 being connected to junction $V_O$. When the diode CR3 is forward biased as a result of the output of the comparator U1 switching to a low level or low impedance state at junction $V_O$, the resistor R5 is connected in parallel with resistor R4 so as to change the voltage reference level at junction $V_D$ from $\frac{2}{3}$ $V_{CC}$ to $\frac{1}{3}$ $V_{CC}$ in the example being described. As the capacitors C1 and C2 are discharged through resistor R2 and diode CR2, the voltage level at junction $V_B$ will decrease exponentially to $\frac{1}{3}$ $V_{CC}$, at which time, the comparator U1 will sense this condition and cause its output at junction $V_O$ to change to the high level. With junction $V_O$ at the high level, diodes CR3, CR2 and CR1 become reverse biased. When CR3 becomes reverse biased, resistor R5 is taken out of the circuit 10, and consequently, the reference voltage level at junction $V_D$ becomes $\frac{2}{3}$ $V_{CC}$ (its original state), being determined by resistors R3 and R4 only. When diode CR2 becomes reverse biased, the discharging path for the capacitors C2 and C1 is terminated, causing the charging path to capacitors C2 and C1 to be reinstated; and consequently, the voltage at junction $V_B$ begins to rise exponentially. When diode CR1 becomes reverse biased, the discharging path for capacitor C1 is terminated. Consequently, the voltage at $V_B$ begins to rise as capacitors C1 and C2 are charged to repeat the charging and discharging cycles as previously explained.

As a result of this charging and discharging, the output voltage of comparator U1 (FIG. 1) at junction $V_O$ will change from a high level to a low level at a frequency which is inversely proportional to the voltage at junction $V_{IN}$. In other words, as the voltage at junction $V_{IN}$ increases, the charging time for capacitor C1 correspondingly increases, causing the output frequency at junction $V_O$ to decrease. The counter and display 12 receives the digital frequency output from junction $V_O$ and conventionally converts it into a digital value (as for example, counting the number of high level pulses in a fixed period of time) which may be displayed or routed to a utilization device such as a digital processor (not shown) for use therein. The resistor R6 is used as a pull-up resistor; however, it could be used to pull the output of comparator U1 up to a voltage other than $V_{CC}$ so as to avoid exceeding the voltage limits of the output transistors within the comparator U1.

Figure 2:
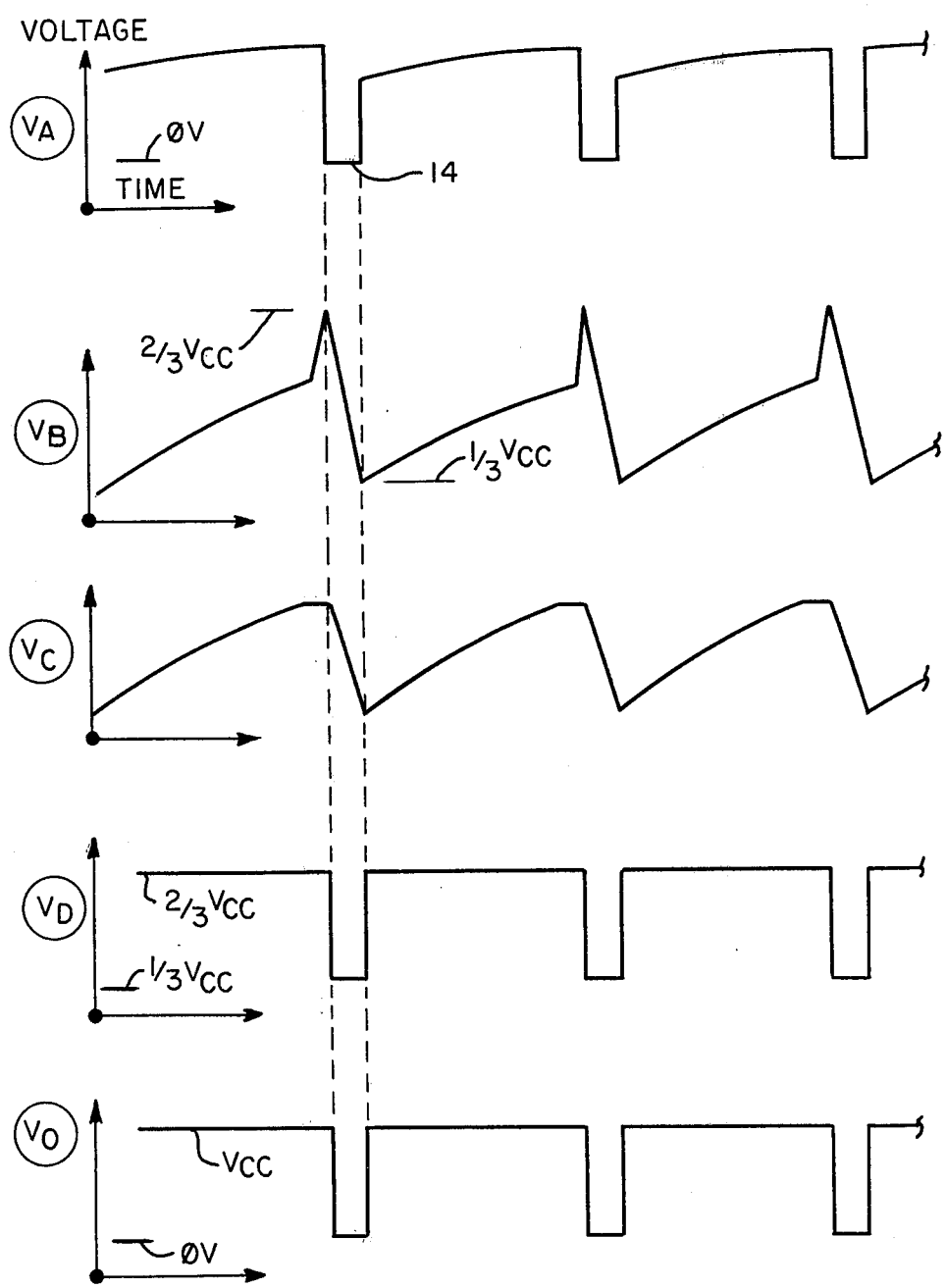
FIG. 2 shows various waveforms associated with the circuit shown in FIG. 1.

FIG. 2 shows the Voltage vs. Time relationships or waveforms as they appear at junctions $V_A$, $V_B$, $V_C$, $V_D$ and $V_O$ in the circuit 10; these waveforms appear to be self-explanatory except for the following comments. The voltage level at point 14 in waveform $V_A$ (FIG. 2) is equivalent to one diode drop and results when diode CR2 in FIG. 1 conducts. The voltage at junction $V_B$ fluctuates between $\frac{2}{3}$ $V_{CC}$ and $\frac{1}{3}$ $V_{CC}$ as shown in approximate form in FIG. 2. A more detailed waveform for the voltage at junction $V_B$ is shown in FIG. 3.

Figure 3:
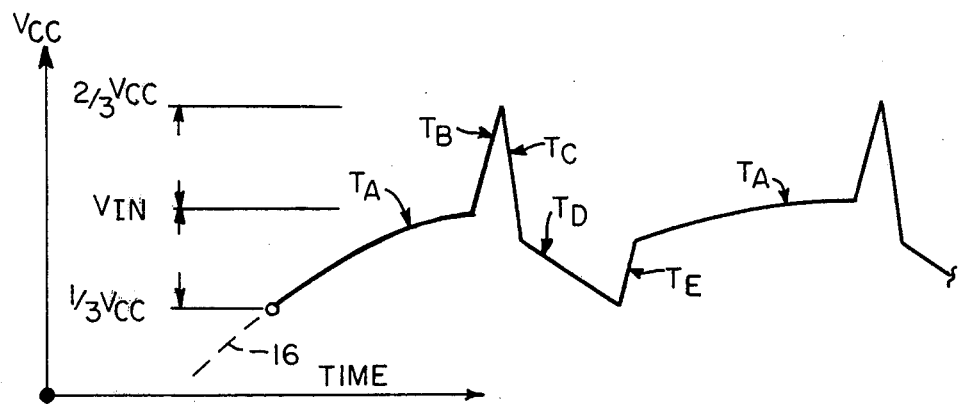
FIG. 3 is a more detailed waveform for the waveform marked $V_B$ in FIG. 2.

The various portions $T_A$, $T_B$, $T_C$ and $T_D$ of the waveform shown in FIG. 3 represent different time constants associated with the voltage at junction $V_B$. There is a certain time needed after the $V_{CC}$ potential is turned on in circuit 10 for the voltage to rise to $\frac{1}{3}$ $V_{CC}$. This is represented by the dashed line 16. The time constant marked $T_A$ in FIG. 3 represents the time that capacitors C1 and C2 are charging via resistors R1 and R2; this can be represented by:

$$T_A = (R1 + R2)(C1 + C2).$$

The time constant marked $T_B$ represents the time during which only capacitor C2 is charging through resistors R1 and R2, with transistor Q1 being turned off at this time; this can be represented by:

$$T_B = (R1 + R2)(C2).$$

Note that the time $T_B$ for capacitor C2 to reach $\frac{2}{3}$ $V_{CC}$ is very small compared to the time $T_A$ which includes the charging time of the very large capacitor C1.

After the capacitor C2 is charged to $\frac{2}{3}$ $V_{CC}$, the output of the comparator U1 changes state as previously described, causing the capacitor C2 to be partially discharged before capacitor C1 begins to be discharged. The time constant marked $T_C$ represents the time that the capacitor C1, alone, is discharged through resistor R2; this can be represented by:

$$T_C = (R2)(C2).$$

Note that the time during which capacitor C2 is discharged alone is very short as represented by the very steep decline of $T_C$ in FIG. 3.

After the voltage level at $V_B$ continues to drop due to capacitor C2 being discharged, the diode CR1 becomes forward biased and conducts, causing capacitor C1 to be discharged along with capacitor C2 through the same discharging path including resistor R2 and diode CR2. The time constant marked $T_D$ in FIG. 3 represents the time period during which both capacitors C1 and C2 are discharged through resistor R2; this can be represented by:

$$T_D = (R2)(C1 + C2).$$

After the voltage level at $V_B$ drops down to $\frac{1}{3} V_{CC}$ as represented by time period $T_D$, the comparator U1 senses this condition and causes its output at junction $V_O$ to change from the low level to a high level. The voltage at $V_B$ rises very quickly from $\frac{1}{3} V_{CC}$ towards $\frac{2}{3} V_{CC}$ as shown in FIG. 3 by the time period $T_E$ for the following reason. When the diode CR1 is forward biased, the voltage at $V_C$ is approximately "one diode drop" or 0.7 volt higher than the voltage at $V_B$. When the diode CR1 becomes reverse biased and the transistor Q1 conducts to begin charging the capacitor C1, the voltage at $V_B$ "slews" or increases rapidly but not instantaneously as indicated by the time period $T_E$ in FIG. 3 because the voltage drop represented by the saturation of transistor Q1 when conducting is only about 0.02 volts. In other words, during the discharge cycle, the voltage at junction $V_B$ is approximately equal to the voltage at junction $V_C$ minus the voltage represented by the "diode drop" of diode CR1. During the charging cycle, the voltage at junction $V_B$ is approximately equal to the voltage at junction $V_C$ plus the saturation voltage of transistor Q1.

Another time period $T_A$ follows time period $T_E$ to repeat the process already described. When the output of the comparator U1 changes to a high level, the $V_{CC}$ potential through resistor R6 reverse biases the diodes CR2 and CR3 to enable the charging process of capacitors C1 and C2 to be repeated. Resistor R6 is chosen so that it can drive diodes CR2 and CR3 in the reverse-biased condition and can also drive a utilization device (not shown) which is connected to the junction $V_O$.

Note that the time constants $T_B$ and $T_C$ in FIG. 3 are very small compared to the time constants $T_A$ and $T_D$. This means that the output frequency at junction $V_O$ is primarily dictated or controlled by the charging and discharging rate of the very large capacitor C1 in response to the input analog voltage at junction $V_{IN}$ and that the charging and discharging rate of the very small capacitor C2 has little effect upon the output frequency compared to capacitor C1. By employing the circuit 10, the output frequency at junction $V_O$ can change in proportion to changes in the input voltage at junction $V_{IN}$ in ratios in excess of 170 to 1.

Another advantage of the circuit 10 is that the reference voltages of $\frac{2}{3} V_{CC}$ and $\frac{1}{3} V_{CC}$ which are established at the (+) input of the comparator U1 (as previously described) are ratios of $V_{CC}$; consequently, the voltage at $V_{CC}$ can have relatively poor regulation and yet not adversely affect the accuracy of the output at junction $V_O$.

Another advantage of the circuit 10 is that it may be conveniently integrated on an IC chip with current technologies. Only the very large capacitor C1 need be placed externally of the chip because it is difficult to fabricate large capacitors on IC chips. Four circuits similar to circuit 10 may be conveniently fabricated on a single, 14-pin, IC chip. For example, each circuit 10 on the chip (not shown) would include 3 external pins connected to the $V_{IN}$, $V_C$ and $V_O$ junctions of the associated circuits 10 making a total of 12 pins (4 circuits times 3 pins per circuit). One external pin for connection to the positive rail or $V_{CC}$ (common to each of the four circuits 10) and one external pin for the negative rail or system ground, when combined with the twelve pins for the four circuits 10, make a convenient 14-pin IC chip.

Figure 4:
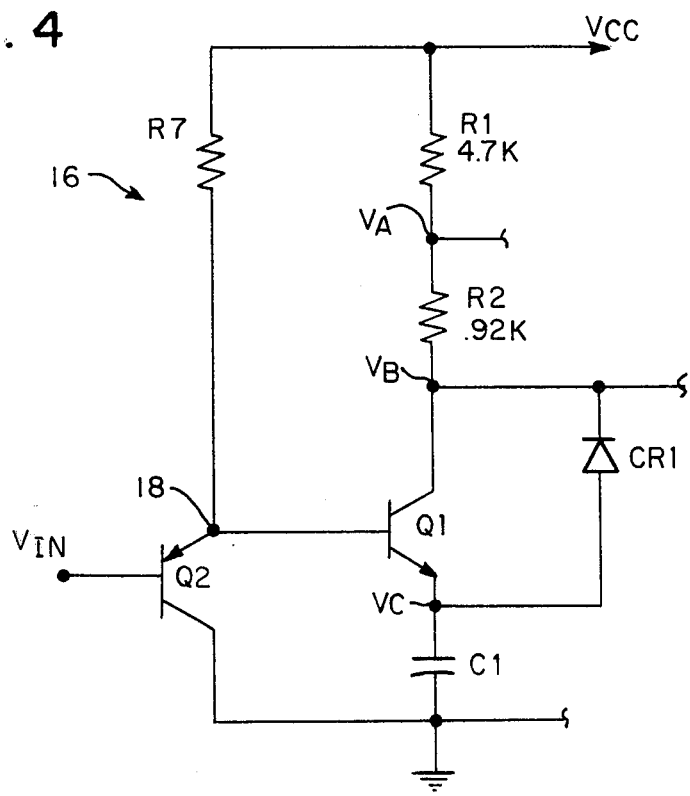
FIG. 4 is a schematic diagram of an input stage which may be added to the circuit shown in FIG. 1.

FIG. 4 is a schematic diagram of a stage 16 which may be added to the input of circuit 10 to compensate for certain base-to-emitter voltage drops. The components including resistors R1 and R2, capacitor C1, diode CR1 and transistor Q1 shown in FIG. 4 comprise a portion of circuit 10 and are identical to their counterparts shown in FIG. 1. The resistor R7 and a PNP transistor Q2 are conventionally added to the circuit 10 as shown in FIG. 4. In the circuit 10 shown in FIG. 1, a 3.0 volt signal applied to $V_{IN}$ becomes approximately 2.3 volt at junction $V_C$ when utilizing 0.7 V as a typical base-emitter voltage drop. With the stage 16 added in FIG. 4, a 3.0 volt signal at $V_{IN}$ becomes 3.6 volts at point 18 and then becomes 3.0 volts at $V_C$ shown in FIG. 4.

I claim:
1. A circuit for generating a digital output signal from an analog input signal applied to said circuit comprising:
   a comparison means having first and second inputs thereto, an output therefrom, and a first reference voltage level at said first input thereof;
   means for storing an electrical charge, said storing means being operatively coupled to said second input;
   first charging means including a switching means for charging said storing means to a voltage which approaches the voltage of said analog input signal and thereafter effectively switching said storing means out of said first charging means;
   second means, coupled to said second input for effectively switching the output of said comparison means from a first state to a second state after said storing means is effectively switched out of said first charging means; and
   third means responsive to said second state of said comparison means for changing the voltage reference level at said first input of said comparison means to a second level, for reducing the voltage on said storing means, and also for enabling the output of said comparison means to switch to said first state when the voltage on said storing means is reduced to approximately said second level;
   said output of said comparison means toggling between said first and second states at a frequency which is dependent upon the voltage of said analog input signal.
2. The circuit as claimed in claim 1 in which said storing means and said second means include, respectively, first and second capacitors.

3. The circuit as claimed in claim 2 in which said first capacitor has a capacity which is substantially greater than the capacity of said first capacitor.

4. The circuit as claimed in claim 3 in which said first and second capacitors have capacities which are, respectively, in the ratio of approximately 1000 to 1.

5. The circuit as claimed in claim 4 further comprising a means for converting the output of said comparison means into a digital signal corresponding to said analog input signal.

6. A circuit for generating a digital output signal from an analog input signal applied to said circuit, comprising:

first and second means for storing an electrical charge;

first charging means including a switching means for charging said first and second storing means whereby said switching means switches said first storing means out of said first charging means when a voltage across said first storing means approaches the voltage on said analog input signal;

a comparison means having first and second inputs thereto and an output therefrom;

second means for supplying a first predetermined voltage to said first input which generates a first state at said output, said first charging means also being effective to raise the voltage level at said second input after said first storing means is switched out of said first charging means by charging said second storing means to cause said comparison means to switch to a second state; and third means responsive to said second state for supplying a second predetermined voltage to said first input and also for partially discharging said second storing means alone and thereafter at least partially discharging said first and second storing means together so that the output of said comparison means toggles or switches back to said first state;

said output of said comparison means toggling between said first and second states at a frequency which is dependent upon the voltage of said analog input signal.

7. The circuit as claimed in claim 6 in which said first and second storing means are first and second capacitors, respectively.

8. The circuit as claimed in claim 7 in which said first capacitor has a capacity which is substantially greater than the capacity of said first capacitor.

9. The circuit as claimed in claim 8 in which said first and second capacitors have capacities which are, respectively, in the ratio of approximately 1000 to 1.

10. The circuit as claimed in claim 6 in which said comparison means includes a comparator and said first and second inputs are, respectively, non-inverting and inverting inputs to said comparator.

11. The circuit as claimed in claim 10 in which said circuit has a system ground and said second capacitor is coupled between said inverting input and said system ground.

12. The circuit as claimed in claim 11 in which said switching means comprises a transistor having a control electrode, with said analog input signal being coupled to said control electrode.

13. The circuit as claimed in claim 12 in which said transistor in an NPN transistor with said first capacitor being connected between said system ground and the emitter of said transistor, said first charging means including a source of electrical potential and first and second resistors being series connected to each other and coupled between said source of electrical potential and the collector of said transistor; and said collector also being coupled to said inverting output of said comparator.

14. The circuit as claimed in claim 13 in which said third means comprises:

a control resistor and a first diode which are series connected to each other and between said non-inverting input and the output of said comparator;

a second diode connected to a junction between said first and second resistors and the output of said comparator; and a third diode having its anode connected to said emitter and its cathode connected to said inverting input of said comparator.

15. The circuit as claimed in claim 13 further comprising means for converting the output of said comparator into a digital signal corresponding to said analog input signal.

* * * * *